United States Patent [19]
Bill et al.

[11] Patent Number: 6,134,146
[45] Date of Patent: Oct. 17, 2000

[54] WORDLINE DRIVER FOR FLASH ELECTRICALLY ERASABLE PROGRAMMABLE READ-ONLY MEMORY (EEPROM)

[75] Inventors: Colin S. Bill, Cupertino, Calif.; Jonathan S. Su, Evanston, Ill.; Takao Akaogi, Cupertino; Ravi P. Gutala, Milpitas, both of Calif.

[73] Assignees: Advanced Micro Devices, Sunnyvale, Calif.; Fujitsu, Ltd., Kanagawa, Japan

[21] Appl. No.: 09/166,385

[22] Filed: Oct. 5, 1998

[51] Int. Cl.[7] .................................................. G11C 16/04
[52] U.S. Cl. .............................. 365/185.23; 365/185.33; 365/185.29
[58] Field of Search ..................... 365/185.23, 185.01, 365/185.26, 185.33, 189.11, 185.22, 243, 226, 185.29

[56] References Cited

U.S. PATENT DOCUMENTS

| | | | |
|---|---|---|---|
| 5,265,052 | 11/1993 | D'Arrigo et al. | 365/189.09 |
| 5,333,122 | 7/1994 | Ninomiya . | |
| 5,371,705 | 12/1994 | Nakayama et al. | 365/189.09 |
| 5,455,789 | 10/1995 | Nakamura et al. | 365/185.17 |
| 5,550,775 | 8/1996 | Abe et al. . | |
| 5,587,951 | 12/1996 | Jazayeri et al. . | |
| 5,668,758 | 9/1997 | Yiu et al. | 365/185.23 |

FOREIGN PATENT DOCUMENTS

| | | |
|---|---|---|
| 0 472 095 A2 | 2/1992 | European Pat. Off. . |
| 0 814 481 A1 | 12/1997 | European Pat. Off. . |

*Primary Examiner*—David Nelms
*Assistant Examiner*—Thong Le
*Attorney, Agent, or Firm*—David G. Alexander; Arter & Hadden LLP

[57] ABSTRACT

A flash Electrically-Erasable Programmable Read-Only Memory (EEPROM) includes a plurality of floating gate transistor memory cells, a plurality of wordlines connected to the cells and a power source for generating a low power supply voltage on the order of 3 V or less. A wordline driver includes a booster for boosting the supply voltage to produce a wordline read voltage which is higher than the supply voltage, and applying the wordline voltage to a wordline. An upper clamp limits a maximum value of the wordline voltage to prevent read disturb. The upper clamp can be configured to reduce an amount by which the maximum value varies with the supply voltage, or to limit the maximum value to substantially a predetermined value. A lower clamp limits the wordline voltage to a minimum value which is higher than the supply voltage and lower than the maximum value for a predetermined length of time at the beginning of the read operation to ensure that the cells have sufficient read current and to reduce the amount by which the minimum value varies with the supply voltage.

28 Claims, 6 Drawing Sheets

WORDLINE DRIVER FOR FLASH ELECTRICALLY ERASABLE PROGRAMMABLE READ-ONLY MEMORY (EEPROM)

BACKGROUND OF THE INVENTION

1. Field of the Invention

The present invention generally relates to the art of microelectronic integrated circuits, and more specifically to a wordline driver for a flash Electrically Erasable Programmable Read-Only Memory (EEPROM).

2. Description of the Related Art

A microelectronic flash or block erase Electrically Erasable Programmable Read-Only Memory (Flash EEPROM) includes an array of cells which can be independently programmed and read. The size of each cell and thereby the memory are made small by omitting select transistors which would enable the cells to be erased independently. All of the cells are erased together as a block.

A memory of this type includes individual Metal-Oxide-Semiconductor (MOS) field effect transistor memory cells, each of which includes a source, drain, floating gate and control gate to which various voltages are applied to program the cell with a binary 1 or 0, or erase all of the cells as a block.

The cells are connected in a rectangular array of rows and columns, with the control gates of the cells in a row being connected to a respective wordline and the drains of the cells in a column being connected to a respective bitline. The sources of the cells are connected together. This arrangement is known as a NOR memory configuration.

A cell is programmed by applying, typically, 9 V to the control gate, 5 V to the drain and grounding the source, which causes hot electrons to be injected from the drain depletion region into the floating gate. Upon removal of the programming voltages, the injected electrons are trapped in the floating gate and create a negative charge therein which increases the threshold voltage of the cell to a value in excess of approximately 4 V.

The cell is read by applying typically 5 V to the control gate, 1 V to the bitline to which the drain is connected, grounding the source, and sensing the bitline current. If the cell is programmed and the threshold voltage is relatively high (4 V), the bitline current will be zero or at least relatively low. If the cell is not programmed or erased, the threshold voltage will be relatively low (2 V), the control gate voltage will enhance the channel, and the bitline current will be relatively high.

A cell can be erased in several ways. In one arrangement, a cell is erased by applying typically 12 V to the source, grounding the control gate and allowing the drain to float. This causes the electrons which were injected into the floating gate during programming to be removed by Fowler-Nordheim tunneling from the floating gate through the thin tunnel oxide layer to the source. Alternatively, a cell can be erased by applying a negative voltage on the order of −10 V to the control gate, applying 5 V to the source and allowing the drain to float.

Power supply voltages for flash EEPROMs are being reduced together with the reduction in feature sizes. A supply voltage of 5 V has been standard in the industry for some time. However, with feature sizes being reduced to values on the order of 0.35 and 0.25 microns, power supply voltages have been reduced to 3 V or less to prevent application of excessive voltages to the smaller cell elements.

A memory cell is conventionally read by applying the positive power supply voltage $V_{cc}$ (conventionally 5 V) to the gate of the cell via the corresponding wordline. However, with smaller cells and supply voltages of 3 V or less, a problem has been encountered in that application of $V_{cc}$ to the gate does not produce enough cell current to ensure a reliable read operation.

A partial solution to this problem is to provide a booster circuit which boosts the wordline read pulse voltage (cell gate voltage) to a value higher than $V_{cc}$, thereby increasing the read current. A prior art booster circuit 2 is illustrated in FIG. 1. A boost capacitor CB is connected in series with a PMOS transistor T1 between the supply voltage $V_{cc}$ and a wordline WL. The load capacitance of the wordline WL is represented by a capacitance CL which appears between the wordline WL and ground.

Another PMOS, transistor T2 is connected between $V_{cc}$ and the wordline WL. A logic circuit 4 has an output connected to the gate of the transistor T2 and an input connected to receive an Address Transition Detector (ATD) signal. The ATD signal is also applied to another logic circuit 6 which has an output connected to the gate of the transistor T1.

The ATD signal is a pulse which is generated for a certain length of time, typically 10 ns, in response to a detection of a change of logical state on an input address pin. The change can be from logical "1" to logical "0" or vice-versa. With reference also being made to FIG. 2, in response to the ATD pulse, the logic circuit 4 applies 0 V to the transistor T2 which turns it on and connects the wordline WL to the supply voltage $V_{cc}$. During this period the logic circuit 6 turns off the transistor T1 and disconnects the boost capacitor CB from $V_{cc}$. Thus, $V_{cc}$ is applied to the wordline WL, and the wordline voltage $V_{WL}=V_{cc}$. This operation precharges the wordline WL.

At the termination of the ATD pulse, the logic circuit 4 turns off the transistor T2 to disconnect the wordline WL from $V_{cc}$. The logic circuit 6 turns on the transistor T1 to connect the boost capacitor CB to $V_{cc}$. A voltage BOOST_CLK which appears across the capacitor CB (at the source of the transistor T1) is referred to as a "kick" signal or voltage, and causes the wordline capacitance CL to charge in accordance with the capacitor divider effect. The wordline voltage $V_{WL}$ increases to a value VH which is higher than $V_{cc}$, typically 4 to 5 V for $V_{cc}$=3 V.

The wordline voltage $V_{WL}$ is thereby boosted above the supply voltage $V_{cc}$ for the duration of the read pulse, causing sufficient current to flow through a memory cell connected to the wordline WL to ensure a reliable read operation. However, a problem has existed in this prior art booster circuit 2 in that the boosted voltage VH varies with $V_{cc}$ which itself can vary due to temperature and other conditions. If the boosted read voltage becomes too high, it can create a condition known as "gate disturb" in which cells on the same wordline as the cell that is being read will have undesired electrons and thereby negative charge transferred to its floating gate due to the high control gate voltage. In an extreme case, this can cause an erased cell to become programmed.

SUMMARY OF THE INVENTION

It is an object of the present invention to provide a wordline driver for a flash Electrically-Erasable Programmable Read-Only Memory (EEPROM) which overcomes the above described limitations of the prior art.

More specifically, a flash Electrically-Erasable Programmable Read-Only Memory (EEPROM) includes a plurality of floating gate transistor memory cells, a plurality of wordlines connected to the cells and a power source for generating a low power supply voltage on the order of 3 V or less. A wordline driver includes a booster for boosting the supply voltage to produce a wordline read voltage which is higher than the supply voltage, and applying the wordline voltage to a wordline.

An upper clamp limits a maximum value of the wordline voltage to prevent read disturb. The upper clamp can be configured to reduce an amount by which the maximum value varies with the supply voltage, or to limit the maximum value to substantially a predetermined value.

A lower clamp limits the wordline voltage to a minimum value which is higher than the supply voltage and lower than the maximum value for a predetermined length of time at the beginning of the read operation to ensure that the cells have sufficient read current and to reduce the amount by which the minimum value varies with the supply voltage.

The booster includes a capacitor connected between the power source and the wordlines. The upper and lower clamps each include an FET connected between the power source and the capacitor, and a regulator for limiting the threshold voltage of the FET to a predetermined value. Each regulator includes a diode-connected NMOS FET connected in series with a diode-connected PMOS FET, and therefore has reduced sensitivity to process variations.

These and other features and advantages of the present invention will be apparent to those skilled in the art from the following detailed description, taken together with the accompanying drawings, in which like reference numerals refer to like parts.

DETAILED DESCRIPTION OF THE INVENTION

Figure 3:
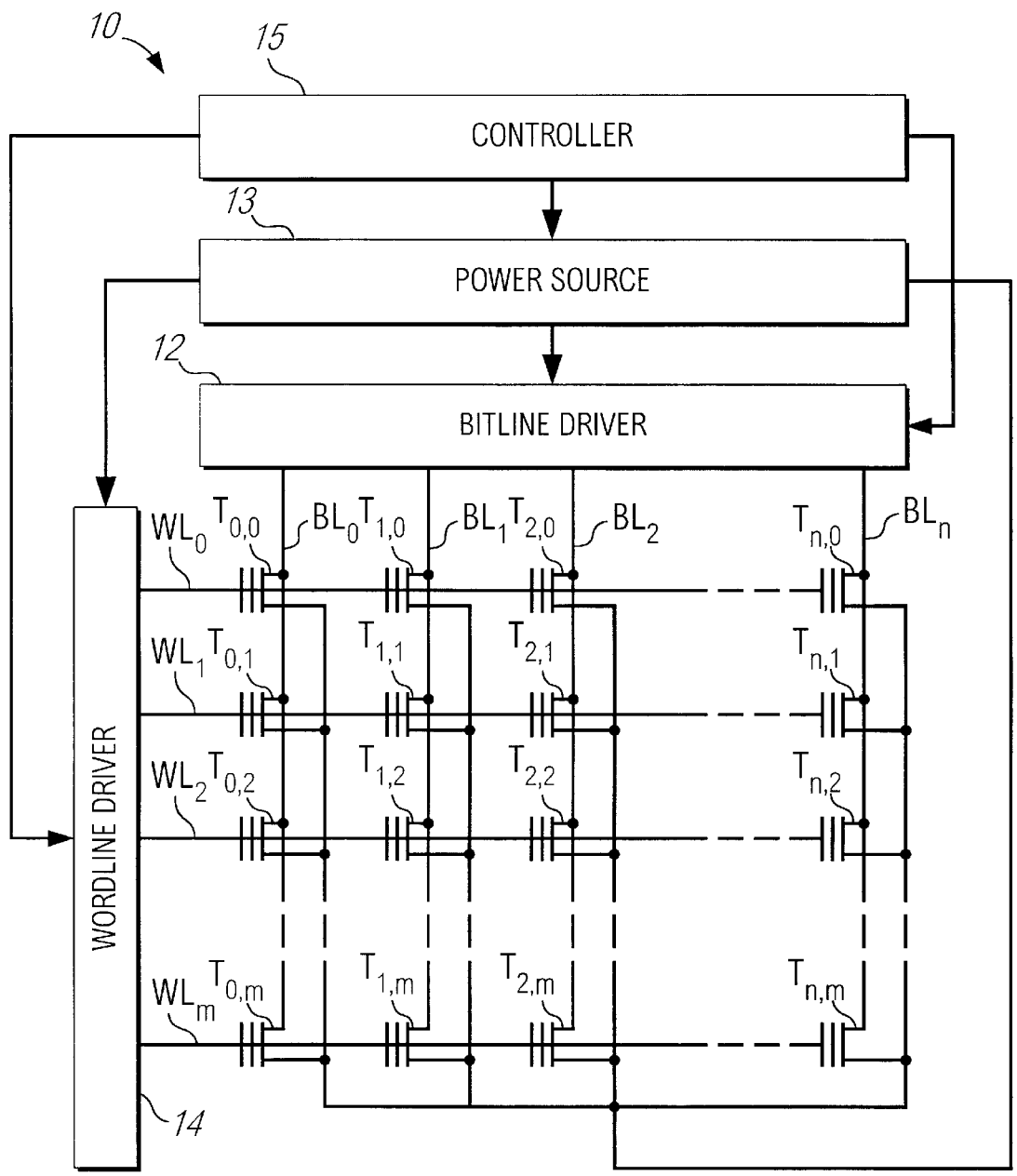
FIG. 3 is a simplified electrical schematic diagram of a flash EEPROM.

FIG. 3 illustrates the basic configuration of a NOR type flash Electrically Erasable Programmable Read-Only Memory (EEPROM) 10 to which the present invention is advantageously applied. The memory 10 comprises a plurality of core or memory cells which are arranged in a rectangular matrix or array of rows and columns. Each row is associated with a wordline, whereas each column is associated with a bitline.

Assuming that there are n columns and m rows, the bitlines are designated as $BL_0$ to $BL_n$ and the wordlines are designated as $WL_0$ to $WL_m$. Appropriate voltages are applied to the bitlines by a bitline driver 12, whereas appropriate voltages are applied to the wordlines by a wordline driver 14. The voltages applied to the drivers 12 and 14 are generated by a power source 13 under the control of a controller 15 which is typically a microprocessor or on-board state machine.

The power source 13 can include on-board and/or off-board power supplies that generate the required voltages, as well as switching circuitry for selectively applying the voltages to the drivers 12 and 14. The power supplies can include charge pumps as are known in the art. The controller 15 also controls the drivers 12 and 14 to address the memory cells individually or collectively as will be described below.

The details of the power source 13 and controller 15 are not the particular subject matter of the present invention and will not be described in detail. A representative example of how power supplies and switching circuitry are used to apply various voltages to the elements of a flash EEPROM is found in U.S. Pat. No. 5,077,691, entitled "FLASH EEPROM ARRAY WITH NEGATIVE GATE VOLTAGE ERASE OPERATION", issued Dec. 31, 1991 to Sameer S. Haddad et al. This patent is incorporated herein by reference in its entirety.

A memory cell is located at each junction of a wordline and a bitline. Each cell includes a Metal-Oxide-Semiconductor (MOS) Field-Effect Transistor (FET) having a source, drain, gate oxide and control gate. The cells of a flash EEPROM differ from conventional FETs in that they additionally include a floating gate and tunnel oxide layer disposed underneath the gate oxide and control gate.

The cells illustrated in FIG. 3 are designated using the notation $T_{n,m}$, where n is the row (wordline) number and m is the column (bitline) number. The control gates of the cells are connected to respective wordlines and the drains of the cells are connected to respective bitlines as illustrated. The sources of all of the cells are connected to the power source 13.

A cell is programmed by applying, typically, 9 V to the control gate, 5 V to the drain and grounding the source, which causes hot electrons to be injected from the drain depletion region into the floating gate. Upon removal of the programming voltages, the injected electrons are trapped in the floating gate and create a negative charge therein which increases the threshold voltage of the cell to a value in excess of approximately 4 V.

The cell is read by applying typically 5 V to the control gate and 1 V to the bitline to which the drain is connected, grounding the source, and sensing the bitline current. If the cell is programmed and the threshold voltage is relatively high (4 V), the bitline current will be zero or at least relatively low. If the cell is not programmed or erased, the threshold voltage will be relatively low (2 V), the control gate voltage will enhance the channel, and the bitline current will be relatively high.

Reading is preferably performed using sense amplifiers and a reference current array. The details of these elements are not the particular subject matter of the present invention.

A cell can be erased in several ways. In one arrangement, a cell is erased by applying typically 12 V to the source, grounding the control gate and allowing the drain to float. This causes the electrons which were injected into the floating gate during programming to be removed by Fowler-Nordheim tunneling from the floating gate through the thin tunnel oxide layer to the source. Alternatively, a cell can be erased by applying a negative voltage on the order of −10 V to the control gate, applying 5 V to the source and allowing the drain to float.

Figure 4:
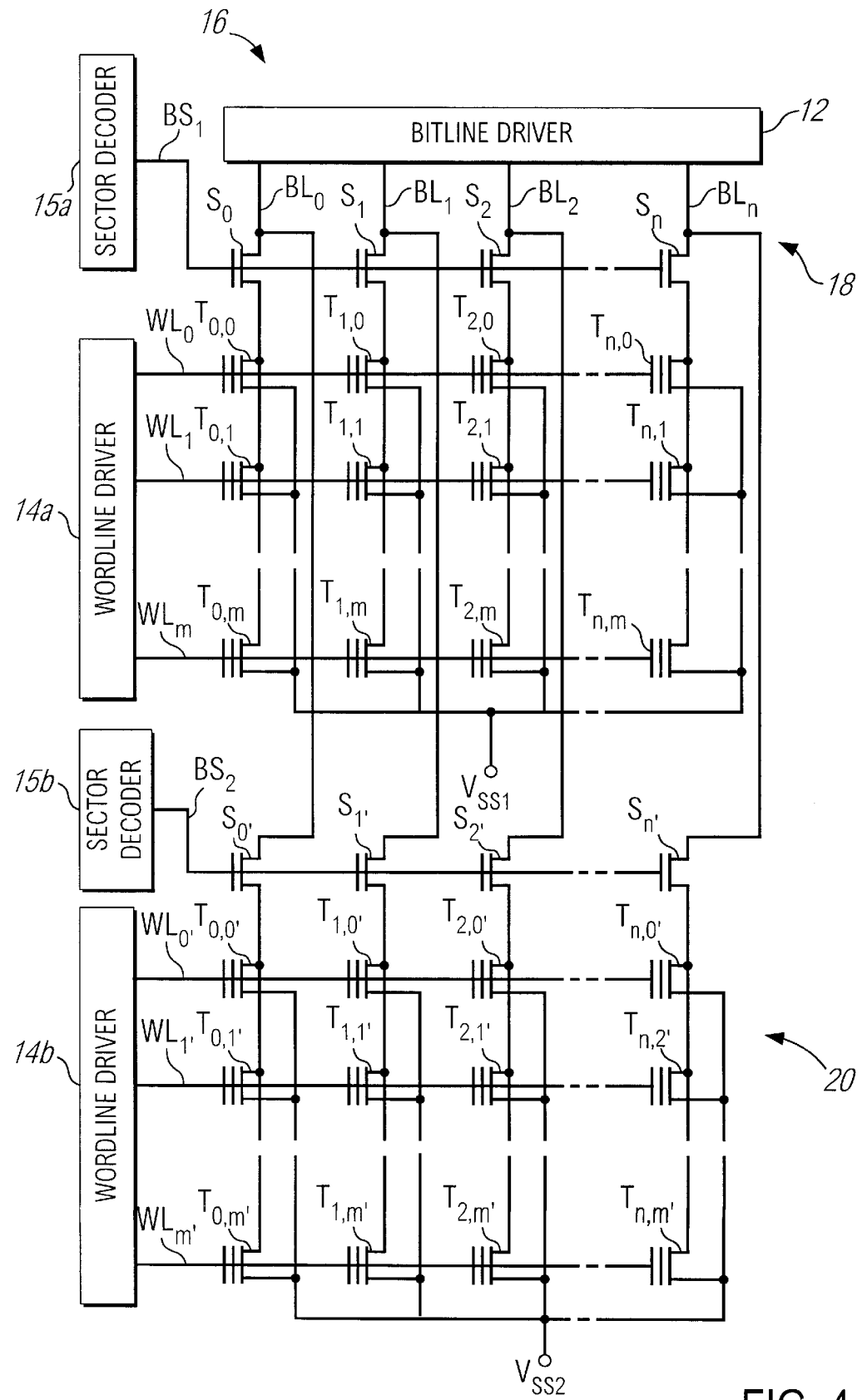
FIG. 4 is similar to FIG. 3 but illustrates a flash EEPROM having cells arranged in pages or banks.

FIG. 4 illustrates another flash EEPROM memory 16 which is similar to the memory 10 except that the cells are divided into a plurality, in the illustrated example two, of banks (also known as pages or sectors), each of which can be programmed, erased and read independently. The memory 16 includes a first cell bank 18 and a second cell bank 20. The memory cells in the first bank 18 are designated in the same manner as in FIG. 3, whereas a prime symbol is added to the designations of the cells in the second bank 20. The wordlines of the banks 18 and 20 are connected to separate wordline drivers 14a and 14b respectively.

In addition to the memory cells, each bank 18 and 20 includes a select transistor for each bitline. The select transistors for the banks 18 and 20 are designated as $S_0$ to $S_n$ and $S_0'$ to $S_n'$ respectively. The drains of the select transistors are connected to the respective bitlines, whereas the sources of the select transistors are connected to the drains of the transistors for the wordlines $WL_0$ to $WL_m$ and $WL_0'$ to $WL_m'$.

The select transistors differ from the memory cell transistors in that they are conventional MOSFETs and lack floating gates. The select transistors are switching elements rather than memory elements. The gates of the select transistors for the bank 18 are connected to a bank select output $BS_1$ of a sector decoder 15a, whereas the gates of the select transistors for the bank 20 are connected to a bank select output $BS_2$ of a sector decoder 15b.

The sources of the cells in bank 18 are connected to a common source supply voltage $V_{ss}1$, whereas the sources of the cells in the bank 20 are connected to a common source supply voltage $V_{ss}2$.

The bank 18 is selected by applying a logically high signal to the bank select line $BS_1$ which turns on the transistors $S_0$ to $S_n$ and connects the bitlines $BL_0$ to $BL_n$ to the underlying memory cells. The bank 18 is deselected by applying a logically low signal to the bank select line $BS_1$ which turns off the transistors $S_0'$ to $S_n'$ and disconnects the memory cells from the bitlines. The bank 20 is selected and deselected in an essentially similar manner using the bank select signal $BS_2$ and select transistors $S_0'$ to $S_n'$. The operation of the memory 16 is essentially similar to that of the memory 10, except that the program, erase and read operations are performed on the banks 18 and 20 sequentially and independently.

Figure 5:
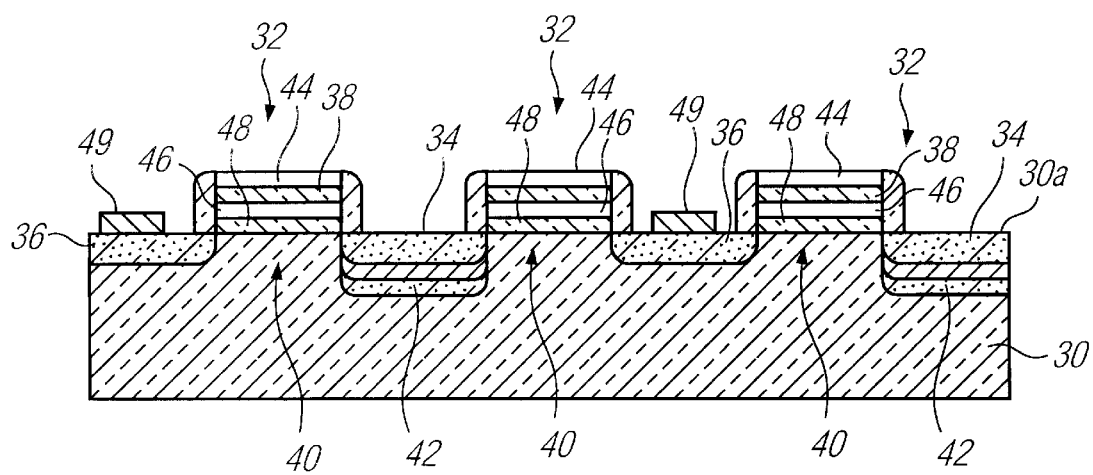
FIG. 5 is a simplified partial sectional view of a flash EEPROM illustrating the elements of the cells thereof.

FIG. 5 is a simplified sectional view illustrating the construction of the individual memory cells of the memory 10 or 16. The memory is formed on a silicon or other semiconductor substrate 30. Three erasable memory cells 32 are illustrated as being formed on a surface 30a of the substrate 30, each including a Metal-Oxide-Semiconductor (MOS) Field-Effect Transistor (FET) structure having a source 34, drain 36, an interdielectric layer 38, and channel 40 underlying a tunnel oxide layer 48. A polysilicon control gate 44 is formed over each gate oxide layer 38, and a polysilicon floating gate 46 and the tunnel oxide layer 48 are formed underneath the control gate 44 over the channel 40.

Each pair of cells 32 is arranged to share a common source 34 and drain 36. The sources 34 are connected to a common source line, whereas a bitline connection 49 is formed on each drain 36.

Figure 6:
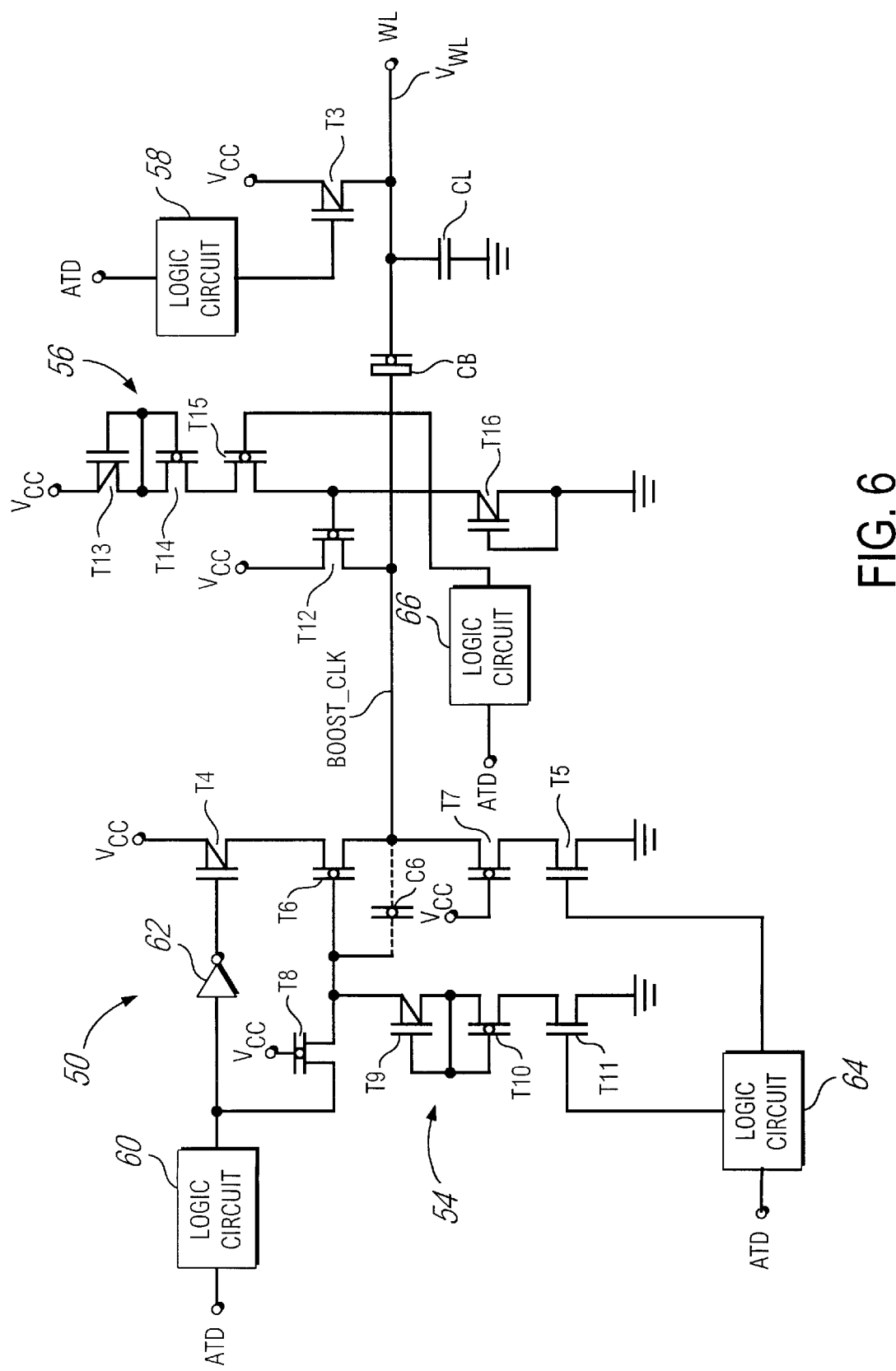
FIG. 6 is a electrical schematic diagram illustrating a wordline driver embodying the present invention.

In accordance with the present invention, the wordline drivers illustrated in FIGS. 3 and 4 comprise a wordline driver circuit 50 for each wordline WL as illustrated in FIG. 6. The circuit 50 includes a wordline booster 52, an upper clamp 54 and a lower clamp 56. The capacitance of the wordline WL is indicated at CL as described above with reference to FIG. 1.

The booster 52 includes a boost capacitor CB which is connected in series with the capacitance CL, a PMOS transistor T3 which is connected between $V_{cc}$ and the wordline WL, and a logic circuit 58 which has an input connected to receive the ATD pulse and another input connected to the wordline WL. The output of the logic circuit 58 is connected to the gate of the transistor T3.

The booster 52 also includes a PMOS transistor T4 having a drain connected to $V_{cc}$ and an NMOS transistor T5 having a source connected to ground. It will be assumed that the power source 13 illustrated in FIG. 3 has a first terminal at which $V_{cc}$ appears and a second terminal at which a lower voltage, in this case ground or 0 V appears. The drain of the transistor T4 is thereby connected to the first terminal, and the source of the transistor T5 is connected to the second terminal of the power source 13.

Intrinsic NMOS transistors T6 and T7 are connected in series between the transistors T4 and T5. Intrinsic transistors differ from conventional NMOS transistors in that they have lower threshold voltages. Whereas the threshold voltage of a conventional NMOS transistor is on the order of 0.8 to 0.9 V, the threshold voltage of an intrinsic NMOS transistor is on the order of 0.4 to 0.5 V. The gate of the transistor T7 is connected to $V_{cc}$.

The booster 52 further includes a logic circuit 60 having an input connected to receive the ATD signal and an output connected through an inverter 62 to the gate of the transistor T4. The output of the logic circuit 60 is also connected through an intrinsic NMOS transistor T8 to the gate of the transistor T6. The gate of the transistor T8 is connected to $V_{cc}$.

The upper clamp 54 includes a diode-connected PMOS transistor T9 which is connected in series with a diode-connected transistor T10, with the drain of the transistor T9 being connected to the gate of the transistor T6. The diode connection consists of the gate and drain of the transistor T9 being connected together, and the gate and drain of the transistor T10 being connected together.

The source of the transistor T10 is connected to ground through an NMOS transistor T11. A logic circuit 64 which receives the ATD signal at an input produces outputs which are connected to the gates of the transistors T5 and T11.

The lower clamp 56 includes an intrinsic NMOS transistor T12 which is connected between $V_{cc}$ and the source of the transistor T6. The lower clamp 56 also includes a diode-connected PMOS transistor T13 which is connected in series with diode-connected intrinsic NMOS transistors T14 and T15. The source of the transistor T15 is connected to the gate of the transistor T12 and also to ground through a PMOS transistor T16. The gate of the transistor T16 is connected to ground which keeps T16 on. The output of the logic circuit 66 is connected to the gate of the transistor T15.

The logic circuits 58, 60, 64 and 66 receive additional logical control inputs which will not be described in detail. The manner in which the logic circuits control the other elements of the driver circuit 50 is presented below.

The wordline driver circuit 50 produces a wordline signal voltage $V_{WL}$ in the form of a read pulse in a manner which is comparable to that, described above with reference to FIG. 1. However, the present wordline driver circuit 50 includes the clamps 54 and 56 which operate in combination with the booster 52 to overcome the problems which exist in the prior art booster circuit. The upper clamp 54 limits the maximum value of the BOOST_CLK or "kick" voltage which appears at the source of the transistor T6, and thereby the wordline voltage $V_{WL}$. The lower clamp 56 functions with the booster 52 to apply a precharge voltage to BOOST_CLK. The amount of precharge is linearly variable with $V_{cc}$ for $V_{cc}$ greater than approximately 2 V.

Figure 7:
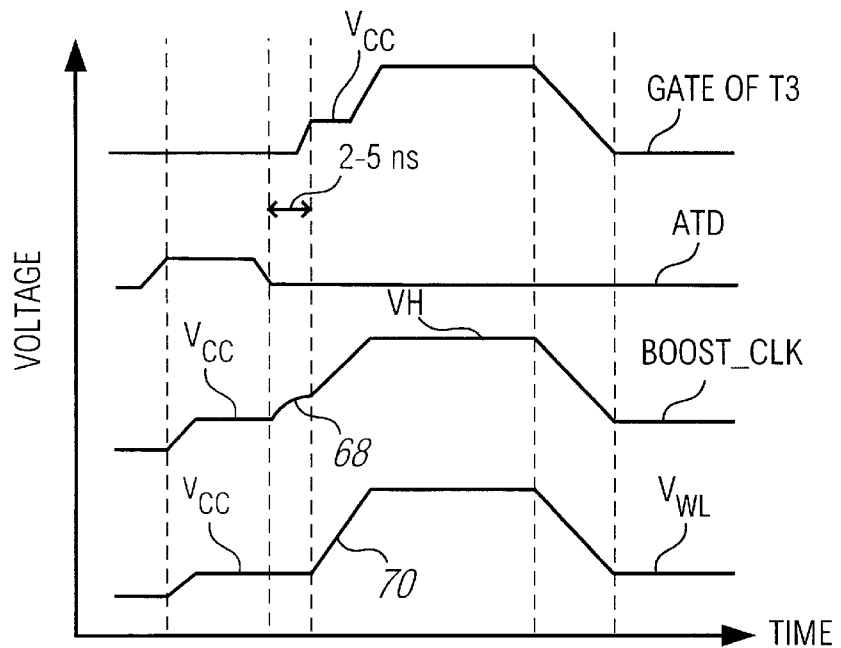
FIG. 7 is a timing diagram illustrating the operation of the wordline driver of FIG. 6.

With reference also being made to FIG. 7, the logic circuits 58, 60, 64 and 66 control the operation of the driver circuit 52 in response to the ATD signal. For the duration of the logically high ATD signal, the logic circuit 58 produces a logically low output signal which turns on the transistor T3 and connects the wordline WL to $V_{cc}$.

The logic circuit 60 produces a low output which is inverted by the inverter 62 and turns off the transistor T4. The logic circuit 64 applies a low output to the gate of the transistor T11 which turns T11 off, and applies a high output to the gate of the transistor T5 which turns on T5. These conditions cause the upper clamp 54 to be effectively disconnected from the booster 52 or de-activated. The logic circuit 66 produces a low output which turns off the transistor T15 and disconnects the lower clamp 56 from the booster 52.

The boost action is initiated by the falling edge of the ATD signal. The logic circuit 58 turns off the transistor T3 2 to 5 ns after ATD, thereby disconnecting the wordline WL from $V_{cc}$ after the initial precharge. The upper clamp 54 remains disconnected by the logic circuits 60 and 64 during the initial portion of the boost action, typically for 2 to 5 ns. Logical circuitry including a timer (not shown) is provided to control the logic circuits 58, 60, 64 and 66 to perform these operations.

In response to the falling edge of the ATD signal, the logic circuit 66 turns on the transistor T15 which completes a circuit path from $V_{cc}$ to ground through the transistors T13 through T16. T16 is a leaker device to prevent overboosting the T12 gate voltage due to the rising BOOST_CLK voltage and the source to gate capacitive coupling of the transistor T12. The voltage at the junction of the transistors T15 and T16 is applied to the gate of the transistor T12 which is turned on and precharges the boost capacitor CB to between 0 V and approximately 1 V linearly dependent on $V_{cc}$.

As viewed in FIG. 7, the BOOST_CLK voltage increases due to the clamp action of the transistor T12 as indicated by a portion of the BOOST_CLK voltage curve at 68. However, the maximum voltage that the BOOST_CLK can reach is limited by the lower clamp 56 to a minimum value VL. In this manner, the BOOST_CLK is precharged to the voltage VL. The action of the lower clamp 56 reduces the variation of the boosted wordline voltage with variations of $V_{cc}$ as will be described below.

After the expiration of the 2 to 5 ns time period, the logic circuit 60 produces a high output which turns on the transistors T4 and T6, and the logic circuit 64 turns on T11 to connect the upper clamp 54 to the booster 52. T5 remains off.

Under these conditions, the boost capacitor CB is connected to $V_{cc}$ through the transistors T4 and T6 and produces the main "kick" voltage. This causes the wordline voltage to rise above $V_{cc}$ as indicated at 70 in FIG. 7. However, the BOOST_CLK voltage is limited to a maximum value VH by the upper clamp 54 and thus prevents the wordline WL from increasing to a level which could cause gate disturb. The action of the upper clamp 54 also reduces the variation of the wordline voltage with variations in $V_{cc}$.

After a predetermined length of time, e.g. 50 ns from the termination of the ATD pulse, the logic circuits 60 and 64 produce low outputs which turn off the transistors T4 and T11 and disconnect the upper clamp 54 from the booster 52. T5 is turned on. The wordline voltage is then reduced to zero by circuitry which is not shown in preparation for another operation.

The upper clamp 54 functions by applying a predetermined gate voltage to the transistor T6. If the kick voltage which is developed across the boost capacitor CB and appears at the source of the transistor T6 attempts to exceed the gate voltage thereof, the transistor T6 will turn off and disconnect the capacitor CB from $V_{cc}$. This prevents the capacitor CB from charging further and prevents the BOOST_CLK voltage from exceeding the maximum value VH.

The maximum BOOST_CLK voltage which is applied to the capacitor CB is determined by the threshold voltages of the transistors T6, T9 and T10. More specifically, the maximum BOOST_CLK voltage $V_{CB}=VT_9+VT_{10}-VT_6$, where $VT_9$, $VT_{10}$ and $VT_6$ are the threshold voltages of the transistors T9, T10 and T6 respectively. The transistor T6 has a source to gate capacitance which is illustrated in broken line at C6. This provides a boost effect which produces current flow through the transistors T9, T10 and T11 and enables the threshold voltage drops to be produced across the transistors T9 and T10. The transistor T8 is provided to isolate the logic circuit 60 from the boost voltage.

The lower clamp 56 functions in a manner similar to the upper clamp 54 by applying a predetermined minimum voltage to the capacitor CB which corresponds to the value VL. The voltage VL which is applied to the capacitor CB is equal to the sum of the threshold voltages of the transistors T12, T13 and T14.

In the clamps 54 and 56, the series connection of PMOS and NMOS transistors is desirable in that it tends to cancel out process dependent threshold voltage variations. The transistor T12 is made much larger than the transistors T13 to T15 since it must pass the entire charging current for the boost capacitor CB during the precharge period 68.

The present wordline driver circuit 50 can be designed to limit the maximum and minimum boost voltages to predetermined limit values as described above. Alternatively, the driver circuit 50 can be designed such that the maximum and minimum boost voltages are allowed to vary with $V_{cc}$, but the variation is much lower than in the prior art.

In a typical wordline booster circuit having a nominal supply voltage value of $V_{cc}$=3V, the actual value of $V_{cc}$ will vary within a range on the order of $V_{cc}$ min=2.7 V to $V_{cc}$ max=3.6V. In this exemplary case, the present wordline driver circuit can be designed to limit the boosted value of the read wordline voltage to a corresponding range on the order of 4 V to 4.6 V.

Figure 1:
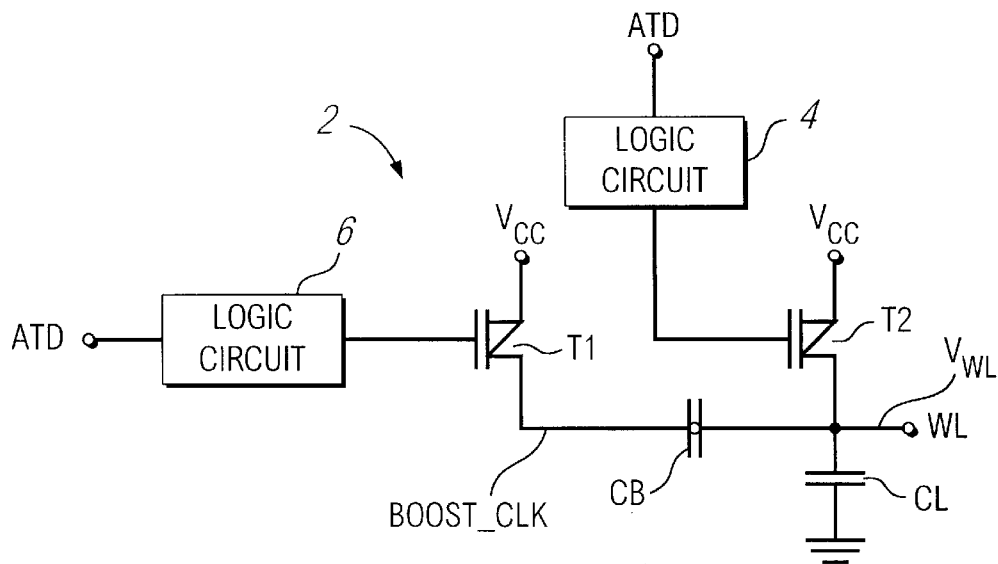
FIG. 1 is an electrical schematic diagram illustrating a booster circuit for a prior art wordline driver.
Figure 2:
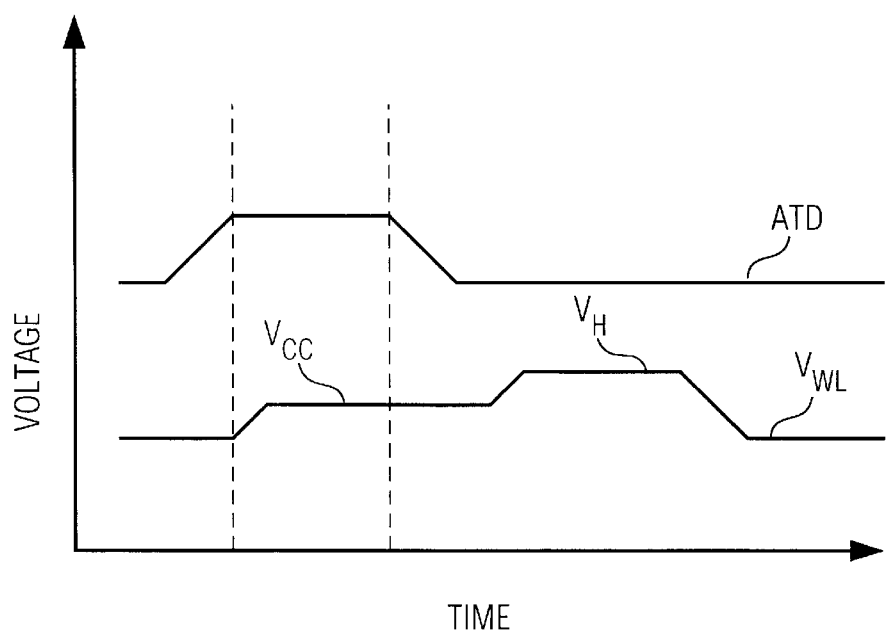
FIG. 2 is a timing diagram illustrating the operation of the booster circuit of FIG. 1.
Figure 8:
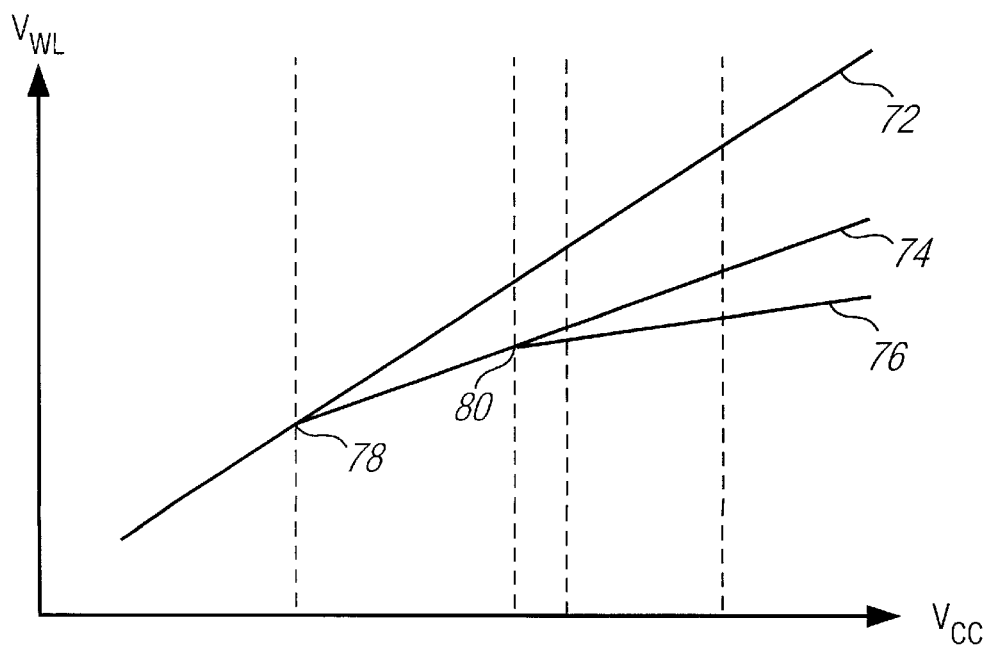
FIG. 8 is a graph illustrating the variation of wordline voltage with power supply voltage for the present invention as compared to the prior art.

As illustrated by a curve 72 in FIG. 8, it can be shown mathematically that in the prior art booster circuit 2 shown in FIG. 1, the variation of the wordline voltage $V_{WL}$ with $V_{cc}$ can be represented as $$V_{WL} = \left(\frac{CB}{CB+CL} + 1\right)V_{cc}$$

where CB and CL in the equation are the values of capacitance of the boost capacitor CB and wordline capacitance CL. The ratio CB/CL+CB is known as the "boost ratio" Br. The curve is steep, indicating a large variation of $V_{WL}$ with $V_{cc}$.

A curve 74 illustrates a case in which only the upper clamp 54 is provided. Once $V_{cc}$ is high enough to activate the clamp mechanism, the wordline voltage follows $V_{cc}$ and is less steep than the curve 72, indicating less overall variation.

A curve 76 illustrates a case in which both the upper clamp 54 and the lower clamp 56 are provided. The variation of $V_{WL}$ can be represented as $$V_{WL} = \left(1 - \frac{CB}{CB + CL}\right) V_{cc}$$

and is lower than for the other two cases. As an example, for a boost ratio Br=0.6, the variation will be $V_{WL}$=1.6 $V_{cc}$ for the prior art arrangement, $V_{WL}$=$V_{cc}$ with only the upper clamp 54 provided and $V_{WL}$=0.4 $V_{cc}$ with both the upper and lower clamps provided.

It will be seen in FIG. 8 that there is a break point 78 at which the curve 74 diverges from the curve 72 due to the action of the upper clamp 54, and a break point 80 at which the curve 76 diverges from the curve 74 due to the action of the lower clamp 56.

In summary, the present invention overcomes the drawbacks of the prior art and provides a wordline driver including a boost circuit which precludes gate disturb and produces a much lower variation of wordline voltage with supply voltage than has been heretofore achieved. It also guarantees a minimum read voltage.

Various modifications will become possible for those skilled in the art after receiving the teachings of the present disclosure without departing from the scope thereof. For example, the transistors T13 to T15 can be connected in series with the transistor T12 as viewed in FIG. 6. However, this embodiment is less preferred than the illustrated arrangement since the sizes of the transistors T13 to T15 would have to be increased to the size of the transistor T12. The arrangement shown allows the transistors T13 to T15 to be small in size and still perform their function of applying a desired gate bias to the transistor T12.

We claim:

1. A flash Electrically-Erasable Programmable Read-Only Memory (EEPROM), comprising:
   a plurality of floating gate transistor memory cells;
   a wordline connected to the cells;
   a power source for producing an electrical supply voltage; and
   a wordline driver connected to the wordline, the driver including:
      a booster for boosting the supply voltage to produce a wordline voltage which is higher than the supply voltage, and applying the wordline voltage to the wordline; and
      an upper clamp for limiting a maximum value of the wordline voltage.

2. A flash EEPROM as in claim 1, in which the upper clamp is configured to reduce an amount by which said maximum value increases with the supply voltage.

3. A flash EEPROM as in claim 1, in which the upper clamp is configured to limit said maximum value to substantially a predetermined value.

4. A flash EEPROM as in claim 1, in which:
   the booster comprises a capacitor connected between the power source and the wordline; and
   the upper clamp is connected between the power source and the capacitor.

5. A flash EEPROM as in claim 4, in which the upper clamp comprises:
   an FET connected between the power source and the capacitor; and
   a regulator for limiting a gate voltage of the FET to substantially a predetermined value.

6. A flash EEPROM as in claim 5, in which the regulator comprises a diode-connected NMOS FET connected in series with a diode-connected PMOS FET.

7. A flash EEPROM as in claim 5, in which:
   the power source comprises a first terminal at which the supply voltage appears and a second terminal at which a voltage which is lower than the supply voltage appears;
   the FET is connected to the first terminal; and
   the regulator is connected between a gate of the FET and the second terminal.

8. A flash EEPROM as in claim 7, in which the regulator comprises a diode-connected NMOS FET connected in series with a diode-connected PMOS FET.

9. A flash EEPROM as in claim 1, further comprising a lower clamp for limiting the wordline voltage to a minimum value which is higher than the supply voltage and lower than said maximum value for a predetermined length of time.

10. A flash EEPROM as in claim 9, in which:
   the booster comprises a capacitor connected between the power source and the wordline; and
   the lower clamp is connected between the power source and the capacitor.

11. A flash EEPROM as in claim 10, in which the lower clamp comprises:
   a Field-Effect Transistor (FET) connected between the power source and the capacitor; and
   a regulator for limiting a gate voltage of the FET to substantially a predetermined value.

12. A flash EEPROM as in claim 11, in which the regulator comprises a diode-connected NMOS FET connected in series with a diode-connected PMOS FET.

13. A flash EEPROM as in claim 11, in which:
   the power source comprises a terminal at which the supply voltage appears;
   the FET is connected to the terminal; and
   the regulator is connected between a gate of the FET and the terminal.

14. A flash EEPROM as in claim 13, in which the regulator comprises a diode-connected NMOS FET connected in series with a diode-connected PMOS FET.

15. A wordline driver, comprising:
   a booster for boosting a supply voltage to produce a wordline voltage which is higher than the supply voltage; and
   an upper clamp for limiting a maximum value of the wordline voltage.

16. A wordline driver as in claim 15, in which the upper clamp is configured to reduce an amount by which said maximum value increases with the supply voltage.

17. A wordline driver as in claim 15, in which the upper clamp is configured to limit said maximum value to substantially a predetermined value.

18. A wordline driver as in claim 15, in which:
   the booster comprises a capacitor connected between the supply voltage and the wordline; and
   the upper clamp is connected between the supply voltage and the capacitor.

19. A wordline driver as in claim 18, in which the upper clamp comprises:
   an FET connected between the supply voltage and the capacitor; and
   a regulator for limiting a gate voltage of the FET to substantially a predetermined value.

20. A wordline driver as in claim 19, in which the regulator comprises a diode-connected NMOS FET connected in series with a diode-connected PMOS FET.

21. A wordline driver as in claim 19, in which:
the supply voltage is produced by a power source having a first terminal at which the supply voltage appears and a second terminal at which a voltage which is lower than the supply voltage appears;
the FET is connected to the first terminal; and
the regulator is connected between a gate of the FET and the second terminal.

22. A wordline driver as in claim 21, in which the regulator comprises a diode-connected NMOS FET connected in series with a diode-connected PMOS FET.

23. A wordline driver as in claim 15, further comprising a lower clamp for limiting the wordline voltage to a minimum value which is higher than the supply voltage and lower than said maximum value for a predetermined length of time.

24. A wordline driver as in claim 23, in which:
the booster comprises a capacitor connected between the supply voltage and the wordline; and
the lower clamp is connected between the supply voltage and the capacitor.

25. A wordline driver as in claim 24, in which the lower clamp comprises:
a Field-Effect Transistor (FET) connected between the supply voltage and the capacitor; and
a regulator for limiting a gate voltage of the FET to substantially a predetermined value.

26. A wordline driver as in claim 25, in which the regulator comprises a diode-connected NMOS FET connected in series with a diode-connected PMOS FET.

27. A wordline driver as in claim 25, in which:
the FET is connected to the supply voltage; and
the regulator is connected between a gate of the FET and the supply voltage.

28. A wordline driver as in claim 27, in which the regulator comprises a diode-connected NMOS FET connected in series with a diode-connected PMOS FET.

* * * * *